United States Patent
Kim

(10) Patent No.: US 7,754,573 B2
(45) Date of Patent: Jul. 13, 2010

(54) METHOD FOR MANUFACTURING SEMICONDUCTOR DEVICE

(75) Inventor: Sung Jin Kim, Busan (KR)

(73) Assignee: Dongbu Hitek Co., Ltd., Seoul (KR)

( * ) Notice: Subject to any disclaimer, the term of this patent is extended or adjusted under 35 U.S.C. 154(b) by 81 days.

(21) Appl. No.: 12/249,685

(22) Filed: Oct. 10, 2008

(65) Prior Publication Data

US 2009/0098699 A1    Apr. 16, 2009

(30) Foreign Application Priority Data

Oct. 12, 2007    (KR) .................... 10-2007-0103007

(51) Int. Cl.
   *H01L 21/336*    (2006.01)
(52) U.S. Cl. ............... 438/303; 257/E21.626; 257/E21.64; 438/184; 438/230; 438/595; 438/900
(58) Field of Classification Search .......... 257/E21.626, 257/E21.64; 438/184, 230, 303, 595, 900
See application file for complete search history.

(56) References Cited

U.S. PATENT DOCUMENTS

| | | | | |
|---|---|---|---|---|
| 6,858,497 B2 * | 2/2005 | Moriya et al. | ............... | 438/262 |
| 6,967,363 B1 * | 11/2005 | Buller | ............... | 257/288 |
| 7,235,447 B2 * | 6/2007 | Frey et al. | ............... | 438/275 |
| 2005/0048753 A1 * | 3/2005 | Schwan | ............... | 438/595 |
| 2005/0186747 A1 * | 8/2005 | Amos et al. | ............... | 438/301 |
| 2008/0265280 A1 * | 10/2008 | Currie | ............... | 257/190 |
| 2009/0001526 A1 * | 1/2009 | Feustel et al. | ............... | 257/635 |
| 2009/0065870 A1 * | 3/2009 | Li et al. | ............... | 257/368 |

FOREIGN PATENT DOCUMENTS

KR    1020050057950    6/2005

\* cited by examiner

*Primary Examiner*—Asok K Sarkar
(74) *Attorney, Agent, or Firm*—Workman Nydegger

(57) ABSTRACT

A method for manufacturing a semiconductor device. In one example embodiment of the present invention, a method for manufacturing a semiconductor device includes various steps. First, a gate pattern is formed on a substrate. Next, a first oxide layer is formed on the gate pattern. Then, a second oxide layer, a first silicon nitride layer, and a second silicon nitride layer are sequentially formed over the substrate and the first oxide layer. Next, a first etching process is performed to remove horizontal portions of the first and second silicon nitride layers. Then, source/drain regions are formed in the substrate. Next, the vertical portions first and second silicon nitride layers are removed. Then, a third silicon nitride layer is formed over the second oxide layer. Finally, a second etching process is performed to remove horizontal portions of the third silicon nitride layer and the second oxide layer.

13 Claims, 3 Drawing Sheets

METHOD FOR MANUFACTURING SEMICONDUCTOR DEVICE

CROSS-REFERENCE TO A RELATED APPLICATION

This application claims the benefit of Korean Patent Application No. 10-2007-0103007, filed on Oct. 12, 2007 which is hereby incorporated by reference as if fully set forth herein.

BACKGROUND

1. Field of the Invention

The present invention relates to methods for manufacturing a semiconductor device.

2. Description of the Related Art

Generally, semiconductor devices are subjected to an ion implantation process in order to define a source region and a drain region therein. In a typical ion implantation process, a gate electrode pattern and a spacer formed along vertical surfaces of the gate electrode pattern are used as an ion implantation mask. Typically, the spacer has a thickness between 770 Å and 1,500 Å. However, this thickness causes physical stress in a floating gate electrode. Due to the physical stress, the resulting floating gate electrode defines a trap, causing a bake-induced charge gain and loss, which degrades the reliability of the semiconductor device.

SUMMARY OF EXAMPLE EMBODIMENTS

In general, example embodiments of the present invention relate to methods for manufacturing a semiconductor device. Some example embodiments of the invention may increase the reliability of the semiconductor device by reducing physical stress applied to a gate pattern of the device and thereby help to prevent the gate pattern from defining a trap.

In one example embodiment of the present invention, a method for manufacturing a semiconductor device includes various steps. First, a gate pattern is formed on a substrate. Next, a first oxide layer is formed on horizontal and vertical surfaces of the gate pattern. Then, a second oxide layer, a first silicon nitride layer, and a second silicon nitride layer are sequentially formed over exposed surfaces of the substrate and the first oxide layer. Next, a first etching process is performed to remove horizontal portions of the first and second silicon nitride layers such that only vertical portions of the first and second silicon nitride layers remain along the vertical surfaces of the second oxide layer. Then, source/drain regions are formed in the substrate. Next, the vertical portions first and second silicon nitride layers are removed. Then, a third silicon nitride layer is formed over the second oxide layer. Finally, a second etching process is performed to remove horizontal portions of the third silicon nitride layer and the second oxide layer such that only vertical portions of the third silicon nitride layer and the second oxide layer remain along the vertical surfaces of the second oxide layer.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter. Moreover, it is to be understood that both the foregoing general description and the following detailed description of the present invention are exemplary and explanatory and are intended to provide further explanation of the invention as claimed.

BRIEF DESCRIPTION OF THE DRAWINGS

Aspects of example embodiments of the present invention will become apparent from the following detailed description of example embodiments given in conjunction with the accompanying drawings, in which.

DETAILED DESCRIPTION OF EXAMPLE EMBODIMENTS

In general, example embodiments of the present invention relate to methods for manufacturing a semiconductor device. In the following detailed description of the embodiments, reference will now be made in detail to specific embodiments of the present invention, examples of which are illustrated in the accompanying drawings. Wherever possible, the same reference numbers will be used throughout the drawings to refer to the same or like parts. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 1:
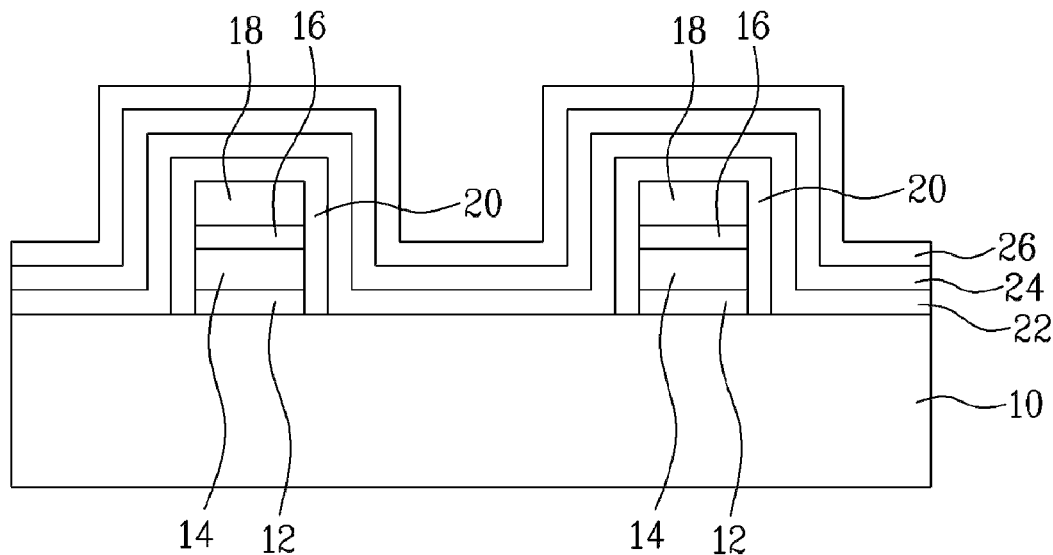
FIGS. 1-5 are views illustrating sequential processes of an example method for manufacturing a semiconductor device.

FIGS. 1 to 5 are views illustrating sequential processes of an example method for manufacturing a semiconductor device. With reference first to FIG. 1, an oxide layer, a first poly-silicon layer, an inter-gate insulating layer, and a second poly-silicon layer are sequentially formed on a semiconductor substrate 10 in which a device isolation layer (not shown) may be formed. Thereafter, all the above-mentioned layers are patterned to form a gate pattern including a tunnel oxide layer 12, a floating gate electrode 14, an Oxide-Nitride-Oxide (ONO) layer 16, and a control gate electrode 18 stacked one above another.

Next, a first oxide layer 20 is formed on the horizontal and vertical surfaces of the gate pattern. The first oxide layer 20 may be a Hot Thermal Oxide (HTO) layer having a thickness between about 60 Å and about 100 Å. Subsequently, a second oxide layer 22, a first silicon nitride layer 24, and a second silicon nitride layer 26 are sequentially formed over the exposed surfaces of the substrate 10 and the first oxide layer 20. The second oxide layer 22 may be a TetraEthyl OrthoSilicate (TEOS) layer and may have a thickness between about 200 Å and about 400 Å. The first silicon nitride layer 24 may have a thickness between about 280 Å and about 320 Å. The second silicon nitride layer 26 may have a thickness between about 280 Å and about 320 Å.

Figure 2:
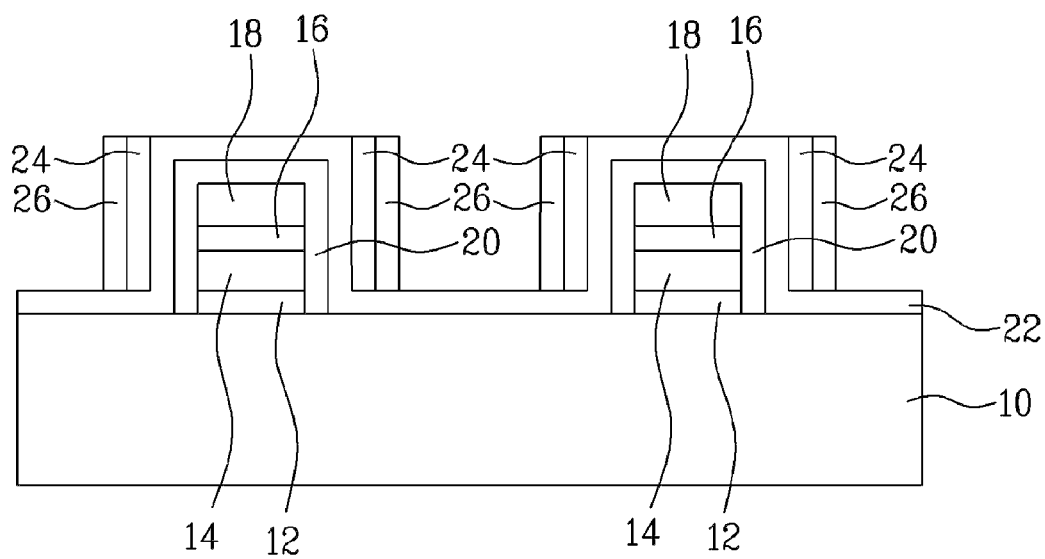

With reference now to FIG. 2, the horizontal portions of the first and second silicon nitride layers 24 and 26 are next subjected to an isotropic etching process. This isotropic etching process results in the horizontal portions of the first and second silicon nitride layers 24 and 26 being removed with only the vertical portions of the first and second silicon nitride layers 24 and 26 remaining along the vertical surfaces of the second oxide layer 22.

Figure 3:
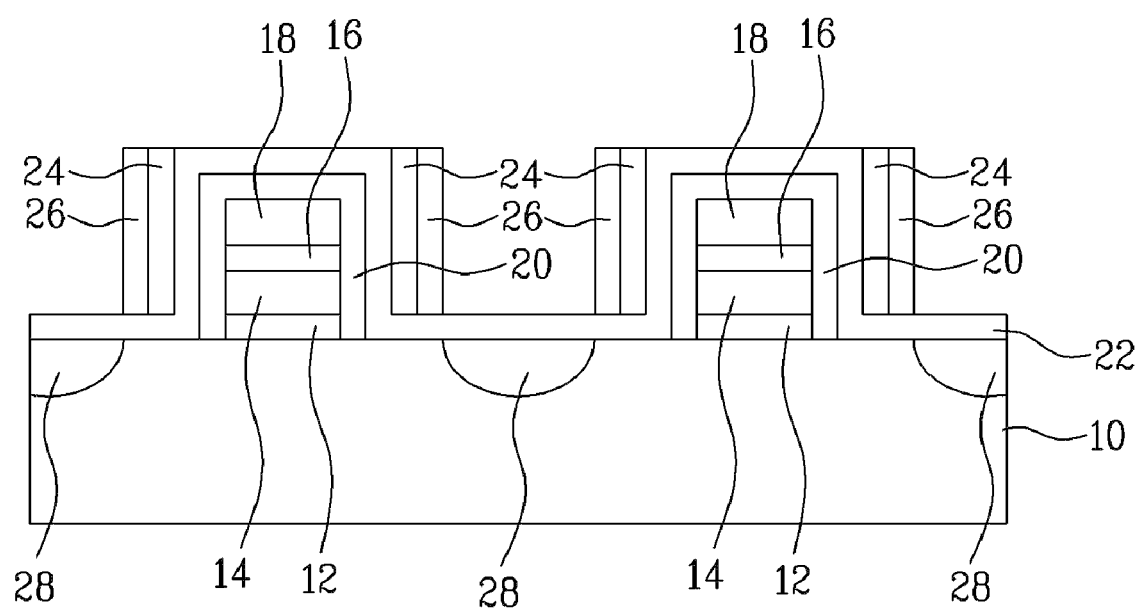

With reference now to FIG. 3, an ion implantation process is next performed, using the remaining horizontal portions of the first and second silicon nitride layers 24 and 26 as an ion implantation mask, resulting in source/drain regions 28. As disclosed in FIG. 3, the horizontal portions of the first and second silicon nitride layers 24 and 26 serve as a spacer for the ion implantation process. By depositing both of the first and second silicon nitride layers 24 and 26, each having a thickness between about 280 Å and about 320 Å, as compared to prior art methods where a single silicon nitride layer is deposited with a thickness between 770 Å and 1,500 Å, it is possible to reduce physical stress applied to the gate pattern and thereby help to prevent the gate pattern from defining a trap.

Figure 4:
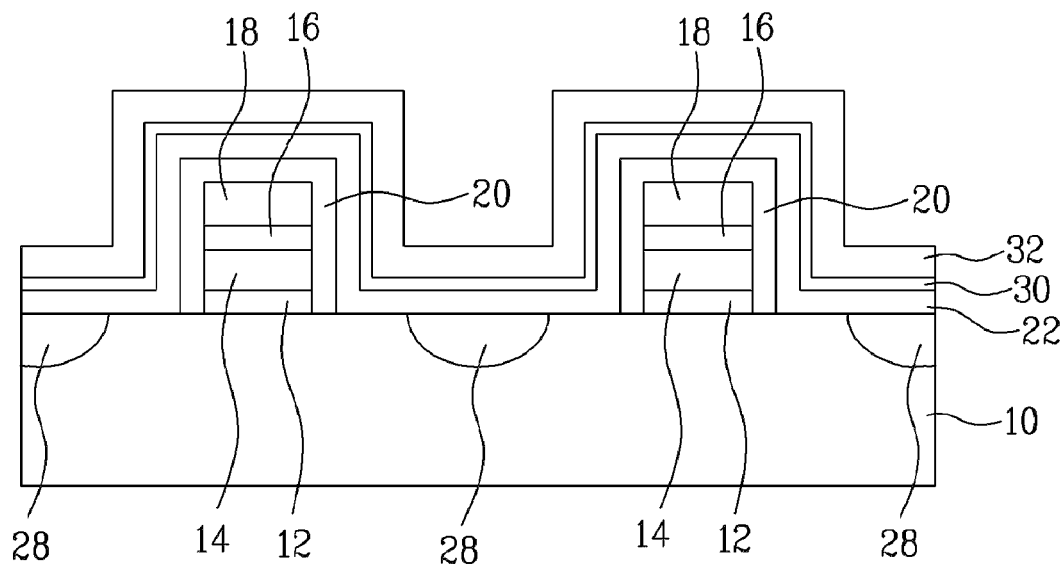

With reference now to FIG. 4, after completion of the ion implantation process, the remaining vertical portions of the first and second silicon nitride layers 24 and 26 are completely removed. Subsequently, a third silicon nitride layer 30 and a third oxide layer 32 may be sequentially formed over the horizontal and vertical surfaces of the second oxide layer 22. The third silicon nitride layer 30 may have a thickness between about 60 Å and about 80 Å. The third oxide layer 32 may be a TEOS layer and may have a thickness between about 300 Å and about 500 Å.

If a metal layer does not form a silicide layer during a silicide process that will be performed subsequently, the metal layer, remaining after performing the silicide process, is removed. The third silicon nitride layer 30 is formed during removal of the metal layer, in order to prevent an undercut and loss of the second oxide layer 22.

Figure 5:
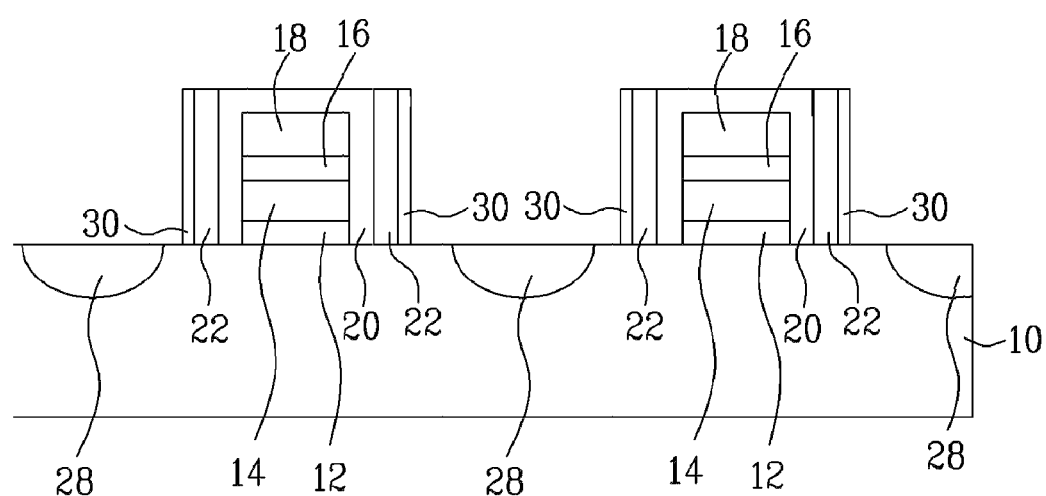

With reference now to FIG. 5, the third oxide layer 32 is next completely removed. Then, the horizontal surfaces of the third silicon nitride layer 30 and the second oxide layer 22 are subjected to an isotropic etching process resulting in the removal of the horizontal portions of the third silicon nitride layer 30 and the second oxide layer 22, such that only the vertical portions of the third silicon nitride layer 30 and the second oxide layer 22 remain along the vertical surfaces of the gate patterns.

Although not shown in the drawings, a silicide process is also performed, to form a silicide layer on the gate pattern and on the source/drain regions.

As described above, in the example method disclosed herein the first and second silicon nitride layers 24 and 26 are deposited such that each has a thickness between about 280 Å and about 320 Å. Thus, compared to prior art methods where only a single silicon nitride layer is deposited at a thickness between 770 Å and 1,500 Å, the example method reduces the physical stress applied to the gate pattern and thereby helps to prevent the gate pattern from defining a trap.

Although example embodiments of the present invention have been shown and described, various modifications and variations might be made to these example embodiments. The scope of the invention is therefore defined in the following claims and their equivalents.

What is claimed is:

1. A method for manufacturing a semiconductor device comprising:
    forming a gate pattern on a substrate;
    forming a first oxide layer on horizontal and vertical surfaces of the gate pattern;
    sequentially forming a second oxide layer, a first silicon nitride layer, and a second silicon nitride layer over exposed surfaces of the substrate and the first oxide layer;
    performing a first etching process to remove horizontal portions of the first and second silicon nitride layers such that only vertical portions of the first and second silicon nitride layers remain along the vertical surfaces of the second oxide layer;
    forming source/drain regions in the substrate;
    removing the vertical portions first and second silicon nitride layers;
    forming a third silicon nitride layer over the second oxide layer; and
    performing a second etching process to remove horizontal portions of the third silicon nitride layer and the second oxide layer such that only vertical portions of the third silicon nitride layer and the second oxide layer remain along the vertical surfaces of the second oxide layer.

2. The method according to claim 1, wherein the first oxide layer is a Hot Thermal Oxide (HTO) layer having a thickness between about 60 Å and about 100 Å.

3. The method according to claim 1, wherein the second oxide layer is a TetraEthyl OrthoSilicate (TEOS) layer having a thickness between about 200 Å and about 400 Å.

4. The method according to claim 1, wherein the first oxide layer is formed only on horizontal and vertical surfaces of the gate pattern.

5. The method according to claim 1, wherein the first and second etching processes are isotropic etching processes.

6. The method according to claim 1, wherein the third silicon nitride layer has a thickness between about 60 Å and about 80 Å.

7. The method according to claim 1, further comprising:
    performing a silicide process on the gate pattern and on the source/drain regions, to form a silicide layer.

8. The method according to claim 1, wherein the source/drain regions are formed by performing an ion implantation process using the first and second nitride layers as a mask.

9. The method according to claim 1, wherein the first and second silicon nitride layers have substantially the same thickness.

10. The method according to claim 9, wherein the first and second silicon nitride layers each have substantially the same thickness that is between about 280 Å and about 320 Å.

11. The method according to claim 1, further comprising:
    forming a third oxide layer on the third silicon nitride layer to form a silicide layer.

12. The method according to claim 11, wherein the third oxide layer is a TEOS layer having a thickness between about 300 Å and about 500 Å.

13. The method according to claim 1, wherein the gate pattern comprises a tunnel oxide layer, a floating gate electrode, an Oxide-Nitride-Oxide (ONO) layer, and a control gate electrode stacked one above another.

* * * * *